United States Patent [19]

Doo et al.

[11] 4,089,992
[45] May 16, 1978

[54] METHOD FOR DEPOSITING CONTINUOUS PINHOLE FREE SILICON NITRIDE FILMS AND PRODUCTS PRODUCED THEREBY

[75] Inventors: Ven Y. Doo, Poughkeepsie; Donald R. Nichols, Patterson; Gene A. Silvey, Elizaville, all of N.Y.

[73] Assignee: International Business Machines Corporation, Armonk, N.Y.

[21] Appl. No.: 718,720

[22] Filed: Aug. 30, 1976

Related U.S. Application Data

[63] Continuation of Ser. No. 142,013, May 10, 1971, abandoned, which is a continuation of Ser. No. 629,338, Feb. 8, 1967, abandoned, which is a continuation-in-part of Ser. No. 494,790, Oct. 11, 1965, abandoned.

[51] Int. Cl.² .............................................. B05D 5/12
[52] U.S. Cl. .................................. 427/94; 427/248 A; 357/52; 357/54; 357/73
[58] Field of Search ............... 427/94, 248 A; 357/52, 357/54, 73

[56] References Cited

U.S. PATENT DOCUMENTS

| | | | |
|---|---|---|---|
| 448,915 | 3/1891 | Erlwein | 427/112 |
| 3,200,015 | 8/1965 | Kuntz | 427/248 R |
| 3,226,194 | 12/1965 | Kuntz | 423/344 |
| 3,328,214 | 6/1967 | Hugle | 357/35 |
| 3,455,020 | 7/1969 | Dawson et al. | 357/23 |
| 3,465,209 | 9/1969 | Denning et al. | 357/65 |
| 3,503,798 | 3/1970 | Yoshioka et al. | 427/94 |
| 3,520,722 | 7/1970 | Scott, Jr. | 427/314 |
| 3,531,696 | 9/1970 | Haneta et al. | 357/23 |
| 3,565,674 | 2/1971 | Boland et al. | 427/94 |
| 3,573,096 | 3/1971 | Tombs | 427/94 |
| 3,649,886 | 3/1972 | Kooi | 427/94 |
| 3,652,324 | 3/1972 | Chu et al. | 427/94 |
| 3,788,894 | 1/1974 | Scherber | 427/94 |

FOREIGN PATENT DOCUMENTS

| | | | |
|---|---|---|---|
| 1,190,308 | 10/1959 | France | 427/94 |
| 1,006,803 | 10/1965 | United Kingdom | 427/94 |

OTHER PUBLICATIONS

Chemical Abstracts, "Semiconductor Device", p. 1321$h$, 1964.
Doo, "Silicon Nitride, A New Diffusion Mask," in IEEE Transactions on Electron Devices, vol. ED-13(7), pp. 561-563, Jul. 1966.
Doo et al., "Preparation and Properties of Pyrolytic Silicon Nitride", in J. Electrochem. Soc., 113(12), pp. 1279-1281, Dec. 1966.
Bean et al., "Some Properties of Vapor Deposited Silicon Nitride Films Using the $SiH_4$-$NH_3$-$H_2$ System," in J. Electrochem. Soc.: Solid State Science, 114(7), pp. 733-737, Jul. 1967.
Chu et al., "The Preparation and Properties of Amorphous Silicon Nitride Films", in J. Electrochem. Soc., 114(7), pp. 717-722, Jul. 1967.
Schaffer et al., "Vapor Phase Growth and DC Breakdown of Silicon Nitride Films", in Amer. Ceramic Soc. Bull., 49(5), pp. 536-538, 1970.

*Primary Examiner*—Cameron K. Weiffenbach
*Attorney, Agent, or Firm*—Henry Powers

[57] ABSTRACT

A substrate article coated with a pinhole free film of silicon nitride produced by reacting silane with a nitrogen containing compound which upon decomposition produces nascent nitrogen and sufficient amounts of a carrier gas that is inert to the reactants and heating said substrate to a temperature above about 500° C to cause the deposition of silicon nitride film on said substrate.

7 Claims, 4 Drawing Figures

U.S. Patent    May 16, 1978    4,089,992
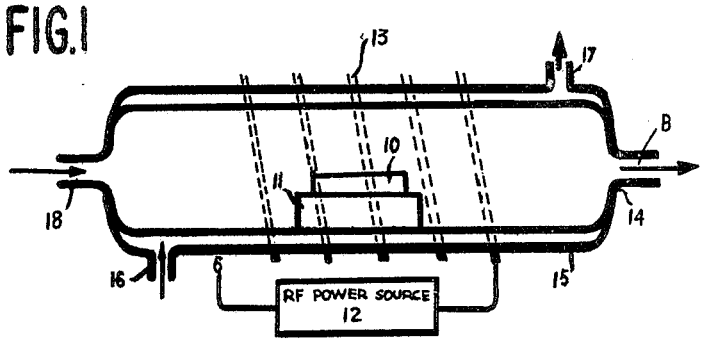
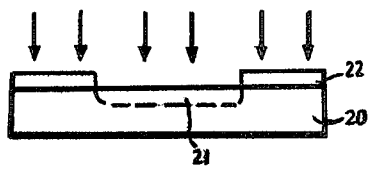
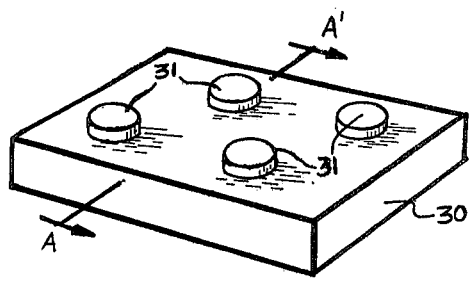
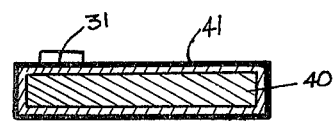

METHOD FOR DEPOSITING CONTINUOUS PINHOLE FREE SILICON NITRIDE FILMS AND PRODUCTS PRODUCED THEREBY

This application is a continuation of copending application Ser. No. 142,013 entitled "Method for Depositing Continuous Pin Hole Free Silicon Nitride Films and Products Produced Thereby" filed May 10, 1971, now abandoned, which in turn is a continuation of copending application Ser. No. 629,338 filed Feb. 8, 1967, now abandoned, which in turn is a continuation-in-part to patent application Ser. No. 494,790, entitled "A Method for Depositing Continuous Pinhole Free Silicon Nitride Films and Products Produced Thereby," filed Oct. 11, 1965, now abandoned.

The present invention relates to a method for depositing silicon nitride. More specifically, the invention is concerned with the deposition of pinhole-free films of silicon nitride which are especially useful as diffusant masks on semiconductors and other high temperature materials. As used in the present context, the expression "diffusant mask" refers not only to a barrier which will prevent the diffusion of substance into a body, but also to a barrier which will prevent the out-diffusion of volatile materials from a body on which it is coated.

In the manufacture of semiconductor devices, such as transistors, it is a conventional practice to dope bodies of semiconductor material with various impurities to impart a desired conductivity to a selected zone within the body. One method for carrying out the doping operation is to diffuse an impurity in the vapor state through the surface of the semiconductor body. In order to restrict the zone which is doped and which therefore has its conductivity altered, it is conventional to mask those portions of the surface of the semiconductor body where doping by vapor diffusion is not desired.

Diffusant masks of silicon dioxide have been widely used and are generally acceptable. However, where highly active doping agents are employed, such as boron, or where relatively thin diffusant masking layers are utilized, problems have arisen due to the permeability of the silicon dioxide and other conventional diffusant masks to the doping agent.

Another problem of diffusion arises in the manufacture of various semiconductor devices by techniques such as epitaxial growth. Such procedures involve the induction heating of a susceptor on which the substrate is placed. Despite attempts to eliminate impurities from high temperature susceptor materials, such as graphite, further out-diffusion of impurities is generally experienced. These impurities contaminate the deposited film and make it impossible to control the properties of the deposit within close tolerances.

Therefore, the primary objective of the present invention is to provide a method for depositing diffusant masks which are impermeable to volatile materials or materials which are volatilized at high temperatures. A further object of the invention is to provide a method for depositing thin diffusant masks which are entirely free from pinholes so that impurities are not diffused through the mask. Collateral objects of the invention are to provide bodies coated with diffusant masks which resist the diffusion of semiconductor doping impurities into the body as well as the out-diffusion of impurities from the body.

According to the present invention, it has been discovered that excellent diffusant masks may be provided by the pyrolytic deposition of silicon nitride ($Si_3N_4$) films. The art has previously recognized that such films may be produced by sputtering. However, none of the prior procedures has provided pinhole-free films which are absolutely necessary to the proper functioning of the film as a diffusant mask.

It has now been found that pinhole-free silicon nitride films, particularly suited for use as diffusant masks, may be produced by reacting silicon tetrahydride ($SiH_4$) hereafter called silane, with any nitrogen containing compound which upon decomposition produces nascent nitrogen, such as ammonia, in the presence of any carrier gas that is inert to the reactants, such as for example $H_2$, $N_2$, A, He, Xe and Kr.

This invention also contemplates substrates coated with silicon nitride diffusant masks produced in accordance with the invention.

The present invention will more fully be appreciated in the light of the following detailed description considered with reference to the accompanying drawing.

In the drawing:

FIG. 1 is a schematic side-sectional view of a horizontal reactor and system for carrying out the film deposition technique of the present invention, FIG. 2 is a somewhat schematic side-sectional, edge view of a semiconductor device undergoing vapor diffusion through a mask of silicon nitride deposited in accordance with the invention, FIG. 3 is a perspective view of a susceptor plate having a series of semiconductor wafers positioned on its surface, and FIG. 4 is a side-sectional view along line A-A' of FIG. 3.

Referring to FIG. 1 of the drawing, there is illustrated a typical system for carrying out the present invention. Substrate 10, such as a body of semiconductor or susceptor material to be provided with a diffusant mask, is positioned on susceptor 11 in reaction chamber 14.

The reactor 14 is in the form of a tube surrounded by a cooling jacket 15 which is provided with inlet 16 and outlet 17 for circulating a suitable cooling fluid. Cooling of the reactor walls inhibits extraneous decomposition of the reaction mixture.

Susceptor 11 is heated by any suitable means, preferably by coupling with RF power source 12 through coil 13.

Ports 18 and 19 are provided at opposite ends of the reactor tube for admission of the reactant mixture and removal of gaseous reaction products.

In operation, the reactor is flushed with gas and RF power source is actuated to heat substrate 10 to a temperature above about 500° C and preferably in the range of from about 700° to 1100° C.

A mixture of the reactants is then introduced into the reactor through port 18. A slight positive pressure of reactant mixture input is maintained so that the mixture sweeps continuously over the substrate surface and exits through port 19.

The reaction mixture is proportioned so that the nitrogen containing compound which upon decomposition produces nascent nitrogen, such as ammonia, or elemental nitrogen is at least present in stoichiometric amount for the formation of silicon nitride ($Si_3N_4$) by reaction with silane. The carrier gas for the reaction inert to the reactants is present in sufficient excess to inhibit the reaction rate.

The ratio of the silane to ammonia by volume may therefore range from about 3:4 (stoichiometric) to 1:300 or more. In a tubular quartz reactor having a diameter of about 5 cm, an inert carrier gas flow rate of at least several liters per minute, preferably 8-20 l/min. provides a satisfactory excess of inert carrier gas. With increased diameter of reactor the flow rate is increased proportionately.

The excess of such carrier gas is very important. It retards and controls the reaction and serves as a carrier, so that a good gas flow pattern is obtained. The gas flow pattern contributes to the formation of a uniform film.

It has been found that the presence of an excess of carrier gas in the reactant mixture causes the deposition of silicon nitride to take place selectively at the region of maximum temperature in the reactor, namely the substrate itself, and results in a pinhole-free film.

In a first example, a silicon substrate is heated to a temperature ranging from 750° to 1100° C., in a reactor as shown in FIG. 1. A 1:40 mixture of silane and ammonia is mixed with hydrogen and flowed over the substrate. The flow rate of the hydrogen in the mixture is about 4 l/min. On contact with the substrate a film of silicon nitride is deposited from the reaction mixture. A film having a thickness of several hundred angstroms may be built up in about 15 minutes of such deposition. In a second example, all conditions were the same except that the hydrogen flow rate was increased to 10 l/min. By increasing this flow more consistent wafer to wafer thickness was obtained in the same deposition run.

In a third example, $N_2$ was substituted for the $H_2$ carrier gas. The reaction was loaded and the system pumped down to 10% pressure. The system was filled with $N_2$. The exhaust was opened and $N_2$ flow was adjusted to 20 l/min. RF power was turned on. Temperature raised to 800°-900° C. Both $NH_3$ and $SiH_4$ gas streams introduced and caused to react. Following 15 minutes of reaction and deposition the flow of the reactants was terminated. The RF power was turned off, the reactor was unloaded and permitted to cool. A film thickness and silicon nitride again of the order of several hundred angstroms was grown.

According to this procedure, deposition rates of from 100 to 400 angstroms per minute are achieved and pinhole-free, uniform films of silicon nitride having a thickness of from 0.1 to 2.0 microns have been successfully grown on silicon, silicon dioxide, graphite and other substrates. The resistivity of such films is in the range of $10^{10} - 10^{14}$ ohms per centimeter and the dielectric constant of such films is in the range of from 6 to 8.

Comparing the properties of the resulting silicon nitride films with those of conventional silicon dioxide films, it has been found that a silicon nitride film having a thickness of 800 angstroms will mask boron diffusion at 1200° C. for 30 minutes. This is a substantial improvement over the masking ability of a silicon dioxide film of like thickness. In addition, a film of silicon nitride deposited in this manner is etched by concentrated hydrofluoric acid at the rate of only 100 angstroms per minute which is a factor 100 times slower than the etching rate of silicon dioxide by the same etchant.

Regions of the semiconductor or other substrate coated by the silicon nitride film may be defined by application of a suitable mask which remains in place during the deposition. After the deposition has been completed, the mask is removed and, as shown in FIG. 2, the assembly may be subjected to a diffusion doping procedure. For example, boron or other semiconductor impurity may be diffused (arrows) into a body of semiconductor material 20 at a temperature of about 1200° for about a half an hour. Due to the pinhole-free condition of the silicon nitride film, the diffusion zone 21 is restricted to the zone beneath the unmasked surface of the semiconductor body. Silicon nitride film 22 entirely prevents diffusion into the underlying portions of semiconductor body 20. The silicon nitride diffusant mask may be removed by slow dissolution in concentrated HF or by reverse sputtering.

Silicon and germanium wafers partly masked with silicon nitride film, as shown in FIG. 2, have been subjected to impurity diffusions. The silicon nitride has masked all the diffusants that have been tried. The diffusion conditions, the junction depth and the surface concentration as measured in the unmasked region and the thickness of silicon nitride film used for mask appear in the following Table.

TABLE

| Substrate | $Si_3N_4$ Thickness (Å) | Diffusant | Diffusion Temp(° C)/ Time (min) Deposit | Diffusion Temp(° C)/ Time (min) Drive-in | xj(u) w/out mask | Co (atoms/cm w/out mask |
|---|---|---|---|---|---|---|
| Si | 1200 | B | 980/30 | 1200/30 | 2.07 | $7 \times 10^{19}$ |
| Si | 1200 | P | 1100/10 | 1100/20 | 1.8 | $1 \times 10^{21}$ |
| Si | 150 | As | | 1200/120 | 1.44 | $1.4 \times 10^{20}$ |
| Si | 250 | Ga | | 1100/90 | 3.2 | $4 \times 10^{19}$ |
| Si | 250 | O | | 1150/20 | 0.5 | — |
| Ge | 250 | Ga | | 800/120 | 0.92 | $1 \times 10^{19}$ |

The above data show that the silicon nitride masks not only the common diffusants such as boron, phosphorus and arsenic, but also gallium and oxygen for which silicon dioxide fails. The film thicknesses listed above are by no means the minimum thicknesses required for adequate masking. In other words, there is no indication that the films cannot be thinner than 1200° A for masking boron and phosphorus diffusion.

The minimum film thickness required to mask most common dopants in silicon and germanium is about an order of magnitude smaller than silicon dioxide. Silicon dioxide masks are usually over 2,000 angstroms thick, but the present silicon nitride films are effective at thicknesses of only about 200 angstroms. Silicon nitride can be deposited to a sufficient thickness on silicon at 800° C for about 10 to 15 min. for effective masking for most common dopants for silicon. For equivalent masking with silicon dioxide, it requires 300 min. of steam oxidation at the same temperature (800° C). Sharpness of definition is primarily a function of film thickness and since the film thickness required for silicon nitride is much thinner than for silicon dioxide for equivalent masking effect, the nitride mask will have sharper definition than oxide.

As shown in FIG. 3, the present invention has application in the production of improved susceptors, as are used in epitaxial deposition and in systems of the type illustrated in FIG. 1. A susceptor as is generally recognized in the art, is a material capable of coupling with RF power to generate heat by induction.

In use, the susceptor 30, in the form of a rectangular plate or other shape, supports one or more substrates 31. The susceptor is then inductively heated to the temperature required for the particular deposition. For example, the substrates may be a series of silicon semiconductor wafers on which an epitaxial growth of addition silicon is to be made.

According to the present invention, and referring now to FIG. 4, the main susceptor body 40 is provided with an encapsulating film 41 of silicon nitride deposited as described above. Thus, when the susceptor is heated during epitaxial deposition the out-diffusion of impurities is barred by film 41 and contamination of substrate 31 is avoided.

It will be apparent to those skilled in the art that various modifications may be made in the process and products illustratively described herein, without departing from the spirit or scope of the invention as expressed in the following claims.

What is claimed is:

1. A process for depositing a pin-hole free film of silicon nitride of substantially uniform thickness comprising the steps of:
   A. placing a substrate in a reaction zone,
   B. introducing into said zone a mixture consisting essentially of silane, a gaseous nitrogen containing compound which upon decomposition introduces nascent nitrogen wherein the ratio of said silane to said nitrogen compound is from about 3:4 to about 1:300 by volume, and a carrier gas inert to the reactants, wherein said carrier gas is present in an amount sufficient to retard the reaction of said silane and nitrogen compound in said reaction zone, and
   C. heating said substrate to a temperature of from 700°-1100° C to bring about the deposition of a pinhole-free film of silicon nitride of substantially uniform thickness of 0.1-2 microns on the surface of said substrate, wherein the deposition rate is from about 100 to about 400 Angstroms per minute.

2. The process of claim 1 wherein said substrate is a body of semiconductor material and said film of silicon nitride has a thickness of from about 200 to about 1200 Angstroms.

3. The process of claim 1 wherein said nitrogen compound is ammonia.

4. The process of claim 1 wherein the carrier gas is selected from $H_2$, $N_2$, A, He, Xe and Kr.

5. The process of claim 1 further comprising masking said substrate so that part of the surface of said substrate is covered by said silicon nitride film and part is exposed, and diffusing a semiconductor impurity into said substrate through said exposed part.

6. The process of claim 1 wherein said nitrogen containing compound is ammonia, the ratio of said silane to said ammonia is 1:40, by volume, and the carrier gas is hydrogen, the flow rate of said hydrogen being about 1/minute.

7. The process of claim 1 wherein said film is a diffusant mask which is substantially impermeable to volatile materials.